(12) United States Patent
Kim et al.

(10) Patent No.: US 7,662,675 B2
(45) Date of Patent: Feb. 16, 2010

(54) METHOD OF FORMING METAL THIN FILM AND METAL WIRING PATTERN AND METHOD OF MANUFACTURING DISPLAY PANEL

(75) Inventors: Taek Hee Kim, Seoul (KR); Pil Sang Yun, Seoul (KR); Ho Min Kang, Suwon-Si (KR); Bae Hyoun Jung, Seongnam-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/682,420

(22) Filed: Mar. 6, 2007

(65) Prior Publication Data

US 2008/0036955 A1   Feb. 14, 2008

(30) Foreign Application Priority Data

Jun. 21, 2006   (KR) ...................... 10-2006-0055788

(51) Int. Cl.
*H01L 21/00* (2006.01)

(52) U.S. Cl. .............................. 438/149; 257/E29.273
(58) Field of Classification Search .................. 257/59, 257/72, 67, E29.137, E29.273
See application file for complete search history.

(56) References Cited

U.S. PATENT DOCUMENTS

| | | | | |
|---|---|---|---|---|
| 5,367,285 | A | * | 11/1994 | Swinehart et al. ........... 338/308 |
| 5,607,559 | A | * | 3/1997 | Yamada et al. ......... 204/192.13 |
| 6,838,696 | B2 | * | 1/2005 | Kobayashi et al. ............ 257/57 |
| 6,933,568 | B2 | * | 8/2005 | Yang et al. .................. 257/347 |

\* cited by examiner

*Primary Examiner*—David Vu
(74) *Attorney, Agent, or Firm*—F. Chau & Associates, LLC

(57) ABSTRACT

A method of forming a metal thin film includes positioning a substrate in a region corresponding to a target, with the target including silver (Ag) and being provided in a reaction space, supplying an inert gas and an oxygen-containing gas into the reaction space. Moreover, the method further includes forming a silver (Ag)-containing conductive film on the substrate by generating plasma between the target and the substrate.

12 Claims, 11 Drawing Sheets

(a)　　　　　　　　　　　(b)

METHOD OF FORMING METAL THIN FILM AND METAL WIRING PATTERN AND METHOD OF MANUFACTURING DISPLAY PANEL

The present application claims priority from Korean Patent Application No. 10-2006-0055788 filed Jun. 21, 2006, the disclosure of which is hereby incorporated by reference herein in its entirety.

BACKGROUND OF THE INVENTION

1. Technical Field

The present disclosure relates to a method of forming a metal thin film and a metal wiring pattern and to a method of manufacturing a display panel, and more particularly, to a method of forming a low-resistance metal thin film capable of enhancing an adhesive property with a substrate (e.g. glass substrate) using, for example, a silver (Ag)-alloy and to a method of forming a metal wiring pattern using the same.

2. Description of the Related Art

Typically with a liquid crystal display (LCD) panel, an electric field between pixel and common electrodes constituting a unit pixel is changed so that the light transmittance of liquid crystals provided therebetween is controlled, thereby displaying an image.

The LCD panel is generally provided with a plurality of fine metal wiring patterns, and an external grayscale voltage is applied to a unit pixel region through the fine metal wiring pattern, so that the electric field between the pixel and common electrodes is changed.

Conventionally, to form a fine metal wiring pattern, an aluminum (Al) metal wiring is generally formed by forming an Al film on a glass substrate and patterning it. However, with an Al metal wiring, there may be a difficulty encountered in that the wiring resistance may be high. In an attempt to prevent the above difficulty from occurring, studies for using copper (Cu) or silver (Ag) with low wiring resistance as a substance for a metal wiring instead of Al have been actively conducted. Particularly, as Ag has the lowest specific resistivity among wiring substances, a metal wiring with a low wiring resistance can be formed.

However, difficulties may still be encountered because Ag has a poor adhesive property with respect to a lower glass substrate, and as a result an Ag metal wiring may be easily separated from the glass substrate. Further, exposed Ag may be damaged in a subsequent dry etching for patterning, so that it may be very difficult to form a wiring using Ag.

Thus, there is a need for a method of forming a low-resistance metal thin film capable of enhancing an adhesive property with a substrate (e.g. a glass substrate) and a method of forming a metal wiring pattern using the same.

SUMMARY OF THE INVENTION

Exemplary embodiments of the present invention provide a method of forming a metal thin film and a metal wiring pattern with low resistance, in which a gas mixture of argon (Ar) and oxygen-containing gas at a certain ratio is supplied when forming a metal thin film containing silver (Ag) using a Ag-molybdenum (Mo) alloy so that an adhesive property with a lower substrate can be enhanced.

In accordance with an exemplary embodiment of the present invention, a method of forming a metal thin film is provided. The method includes positioning a substrate in a region corresponding to a target, with the target including silver (Ag) and being provided in a reaction space, supplying an inert gas and an oxygen-containing gas into the reaction space. Moreover, the method further includes forming a silver (Ag)-containing conductive film on the substrate by generating plasma between the target and the substrate.

In an embodiment, the oxygen-containing gas is supplied with a supply amount of about 0.1 to about 20% with respect to a supply amount of the inert gas supplied into the reaction space. In another embodiment, the oxygen-containing gas is supplied with a supply amount of about 5 to about 15% with respect to a supply amount of the inert gas supplied into the reaction space. In another embodiment, the oxygen-containing gas is supplied with a supply amount of about 6 to about 8% with respect to a supply amount of the inert gas supplied into the reaction space.

Here, it is preferred that the target containing Ag includes an alloy in which Mo of about 0.1 to about 2 wt % is contained in Ag.

Further, in another embodiment, the inert gas includes argon (Ar) or nitrogen ($N_2$) gas. The method further comprises forming a conductive protection film on the Ag-containing conductive film. The conductive protection film includes IZO (Indium Zinc Oxide).

In accordance with an exemplary embodiment of the present invention, a method of forming a metal wiring pattern is provided. The method includes providing a transparent substrate, forming a silver (Ag)-containing conductive film on the transparent substrate and patterning the Ag-containing conductive film, wherein the Ag-containing conductive film is formed by supplying an inert gas and an oxygen-containing gas.

Further, the forming of the Ag-containing conductive film comprises providing a raw material substance containing an Ag alloy in an upper region of the transparent substrate, and supplying the inert gas and the oxygen-containing gas; and generating plasma in a region between the raw material substance containing the Ag alloy and the transparent substrate.

The Ag-containing conductive film contains molybdemum (Mo) and oxygen.

The oxygen-containing gas is supplied with a supply amount of about 0.1 to about 20% with respect to a supply amount of the inert gas. In an embodiment, the oxygen-containing gas is supplied with a supply amount of about 5 to about 15% with respect to a supply amount of the inert gas. In another embodiment, the oxygen-containing gas is supplied with a supply amount of about 6 to about 8% with respect to a supply amount of the inert gas.

The method further comprises forming a conductive protection film on the Ag-containing conductive film. The conductive protection film includes IZO (Indium Zinc Oxide).

According to an exemplary embodiment of the present invention, a method of manufacturing a liquid crystal display panel is provided. The method includes forming a first silver (Ag)-containing conductive film on a transparent substrate, pattering the first Ag-containing conductive film to form a gate electrode, a gate wiring, a storage electrode wiring and a gate pad; forming a gate insulation film on the entire structure comprising the gate electrode, the gate wiring, the storage electrode wiring and the gate pad formed on the transparent substrate; forming an active layer in an upper region of the gate electrode. The method further includes forming source and drain electrodes provided on the active layer and partially overlapping with the gate electrode, a source wiring connected to the source electrode, and a source pad, wherein the first Ag-containing conductive film is formed by supplying an inert gas and an oxygen-containing gas.

The oxygen-containing gas be supplied with a supply amount of about 0.1 to about 20% with respect to a supply amount of the inert gas. In an embodiment, the oxygen-containing gas is supplied with a supply amount of about 5 to about 15% with respect to a supply amount of the inert gas. In another embodiment, the oxygen-containing gas is supplied with a supply amount of about 6 to about 8% with respect to a supply amount of the inert gas.

The method further comprises the step of forming a first conductive protection film on the first Ag-containing conductive film. The conductive protection film includes IZO (Indium Zinc Oxide).

The forming of the source electrode, the drain electrode, the source wiring and the source pad includes forming a second Ag-containing conductive film on the entire structure having the active layer formed thereon and patterning the second Ag-containing conductive film, wherein the second Ag-containing conductive film is formed by supplying an inert gas and an oxygen-containing gas. The method further comprises the forming of a second conductive protection film on the second Ag-containing conductive film.

After the forming of the source electrode, the drain electrode, the source wiring and the source pad, the method further comprises forming an insulation film on the entire structure comprising the source electrode, the drain electrode, the source wiring and the source pad formed on the transparent substrate, patterning the insulation film to form a drain contact hole opening a portion of the drain electrode, a gate pad contact hole opening a portion of the gate pad, and a source pad contact hole opening a portion of the source pad, forming a transparent insulative film on the entire structure having the contact holes formed thereon and patterning the transparent insulative film to form a pixel electrode connected to the drain electrode through the drain contact hole, a gate contact pad connected to the gate pad through the gate pad contact hole, and a source contact pad connected to the source pad through the source pad contact hole.

According to another exemplary embodiment of the present invention, there is provided a liquid crystal display panel comprising a substrate, a gate wiring including a gate electrode and a gate pad formed on the substrate, a gate insulation film formed on the gate wiring, an active layer formed in an upper region of the gate electrode, and a source wiring including source and drain electrodes provided on the active layer and partially overlapping with the gate electrode, and a source pad, wherein at least one of the sate wiring and the source wiring is formed of silver containing conductive film comprising oxygen.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE EXEMPLARY EMBODIMENTS

Figure 1:
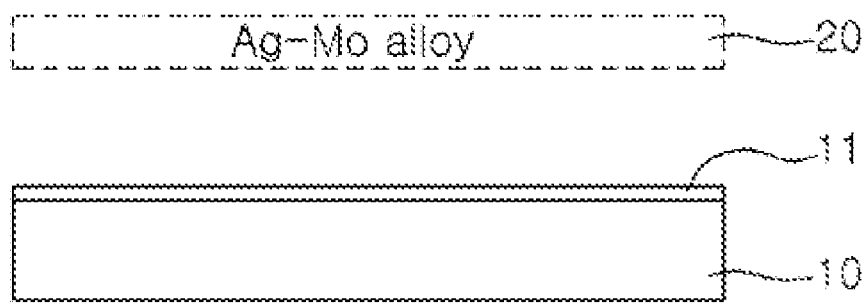
FIGS. 1 to 3 are sectional views illustrating a method of forming a metal wiring pattern according to an exemplary embodiment of the present invention.

Hereinafter, exemplary embodiments of the present invention will be described in detail with reference to the accompanying drawings. However, the present invention is not limited to the exemplary embodiments disclosed below but may be implemented into different forms. Rather, these exemplary embodiments are provided for illustrative purposes only.

In the drawings, the thicknesses of layers and regions are exaggerated for clarity. Like reference numerals are used to designate like elements throughout the specification and drawings. Further, an expression that an element such as a layer, film, region, substrate or plate is placed on or above another element indicates not only a case where the element is placed directly on or just above the other element but also a case where a further element is interposed between the element and the other element. Like numbers refer to like elements throughout. As used herein, the term "and/or" includes any and all combinations of one or more of the associated listed items.

It will be understood that, although the terms first, second, third, may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments of the present invention.

Spatially relative terms, such as "below," "lower", "under," "above", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized exemplary embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Hereinafter, the exemplary embodiments of the present invention will be described in detail with reference to the accompanying drawings.

Figure 2:
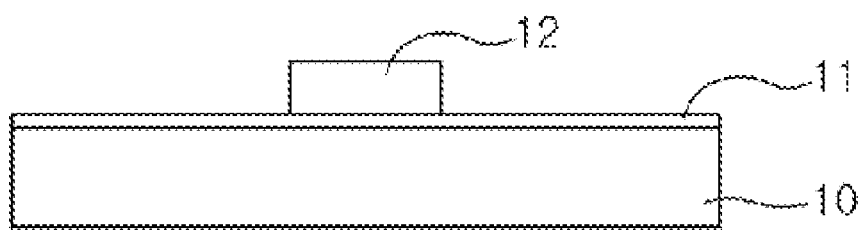
Figure 3:
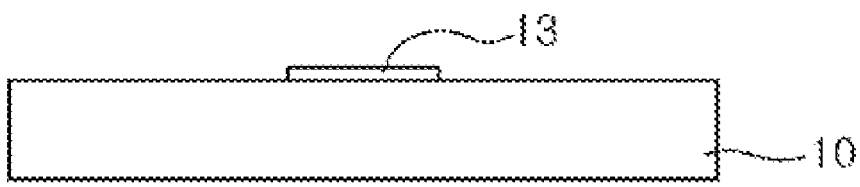

FIGS. 1 to 3 are sectional views illustrating a method of forming a metal wiring pattern according to an exemplary embodiment of the present invention.

Figure 4:
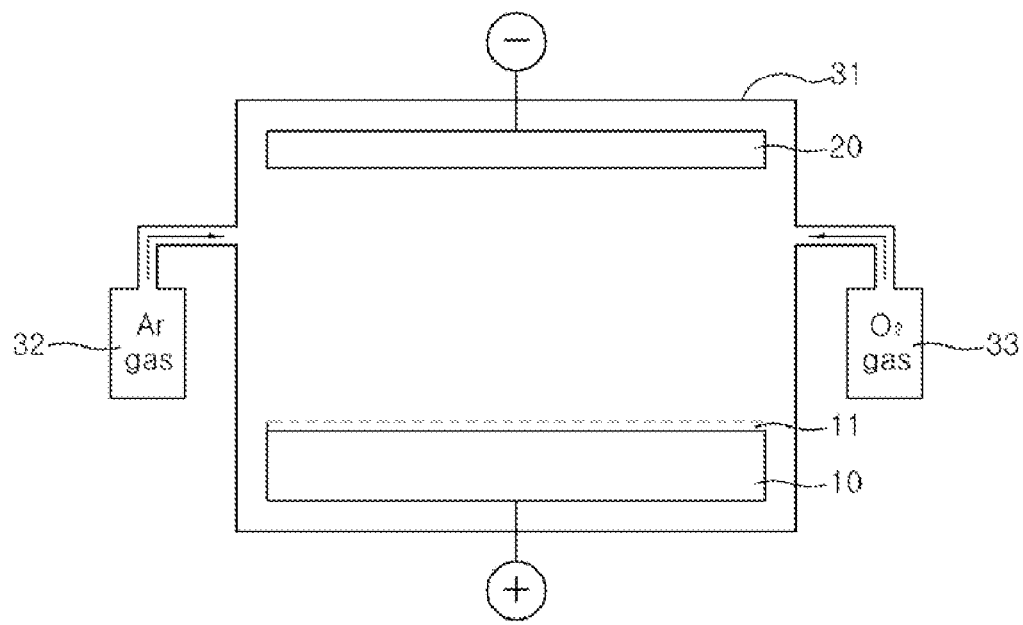
FIG. 4 is a schematic sectional view of an apparatus for forming the metal wiring pattern according to an exemplary embodiment of the present invention.

FIG. 4 is a conceptual sectional view of an apparatus for forming the metal wiring pattern according to an exemplary embodiment.

Figure 5:
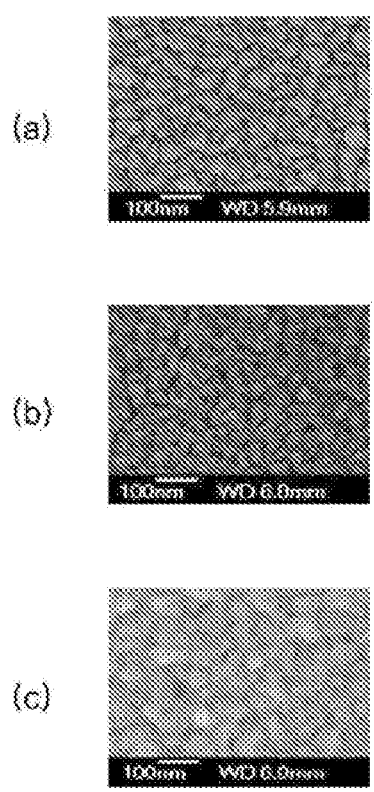
FIG. 5 shows SEM photographs of silver (Ag)-containing conductive film formed on a substrate after a sputtering process.

FIG. 5 shows SEM photographs of a silver (Ag)-containing conductive film formed on a substrate after a sputtering process.

Referring to FIG. 1, a silver (Ag)-containing conductive film 11 is formed on a transparent insulative substrate. In this exemplary embodiment, a glass substrate 10 is used as the transparent insulative substrate. Accordingly, the glass substrate 10 will be described as the prime object in the following descriptions.

Although the Ag-containing conductive film 11 may be formed on the glass substrate 10 through a variety of deposition methods, the Ag-containing conductive film 11, e.g., an alloy film made of Ag and Mo is formed on the substrate through a sputtering process in this exemplary embodiment. A certain amount of oxygen-containing gas is added during a sputtering process to enhance an adhesive property between the Ag-containing conductive film 11 and the glass substrate 10.

As shown in FIG. 4, the sputtering process is performed using an apparatus comprising a chamber 31 having a reaction space, a power supply means for applying power to a target layer 20 and the substrate 10, an inert gas supply means 32 for supplying an inert gas, and an oxygen-containing gas supply means 33 for supplying an oxygen-containing gas ($O_2$).

A silver (Ag)-molybdenum (Mo) alloy is used as the target layer 20. Preferably, an alloy having Mo of about 0.1 to about 2 wt % contained in Ag is used as such an alloy. Preferably, argon (Ar) is used as the inert gas. It will be apparent that a variety of non-reactive gases such as nitrogen ($N_2$) may be used instead of Ar. All the gases capable of oxidizing a metallic atom, such as oxygen ($O_2$), ozone ($O_3$), nitric oxide (NO), carbon monoxide (CO) and carbon dioxide ($CO_2$) may be used as the oxygen-containing gas. Preferably, $O_2$ is used as the oxygen-containing gas in this exemplary embodiment. Also, it is preferred that the oxygen-containing gas ($O_2$) be supplied to the inside of the chamber 31 within a range of about 0.1 to about 20% with respect to the inert gas (Ar). This means that in a case where an amount of the inert gas supplied into the chamber 31 is 100, that of the oxygen-containing gas supplied into the chamber 31 is about 0.1 to about 20%. That is, it is preferred that the ratio (partial pressure ratio: $O_2$/Ar) of the oxygen-containing gas to the inert gas, which are supplied into the chamber 31, be about 0.1 to about 20%. More preferably, a partial pressure ratio of the oxygen-containing gas to the inert gas is about 5 to about 15%, most preferably, about 6 to about 8%. The aforementioned partial pressure ratio may be variously modified depending on a sputtering process condition (e.g., a process temperature, an application power source, a process pressure or the like). As the aforementioned range of the oxygen-containing gas is supplied into the chamber 31 to form the Ag-containing conductive film 11 in this exemplary embodiment, the adhesive strength between the Ag-containing conductive film 11 and the glass substrate 10 can be enhanced and an intermetallic compound produced from reaction of Ag and Mo in the sputtering process can be reduced.

A sputtering process using a sputtering apparatus shown in FIG. 4 will be described below.

First, the glass substrate 10 and the target layer 20 are seated in a reaction space in the chamber 31 so as to face each other. Inert gas and oxygen-containing gas are supplied into the reaction space in the chamber 31, and a power source is applied to at least any one of the glass substrate 10 and the target layer 20. For example, if negative and positive power sources are respectively applied to the glass substrate 10 and the target layer 20, plasma is generated therebetween, ions activated by means of the plasma collide against a surface of the target layer 20 to separate Ag and Mo atoms from the target layer 20. The Ag and Mo atoms separated from the target layer 20 are adsorbed onto the glass substrate 10 to form the Ag-containing conductive film 11.

At this time, the oxygen-containing gas is supplied into the reaction space inside the chamber 31 such that a partial pressure ratio of the oxygen-containing gas with respect to the inert gas is in a range of about 0.1 to about 20% in this exemplary embodiment. That is, in a case where the inert gas of 150 standard cubic centimeters per minute (sccm) is supplied, the oxygen-containing gas of about 0.15 to about 30 sccm is supplied. It is preferred that the inert gas be supplied within a range of about 100 to about 300 sccm. As such, the oxygen-containing gas in the partial pressure ratio range is supplied into the chamber 31, so that the adhesive strength between the glass substrate 10 and the Ag-containing conductive film 11 formed thereon can be enhanced and the generation of the intermetallic compound produced in the sputtering process can be prevented. Further, it can be seen that the Ag-containing conductive film formed by supplying the oxygen-containing gas in the partial pressure ratio range forms a crystalline structure as shown in the photograph of FIG. 5(a).

That is, the Ag atom separated from the target layer 20 reacts with O in the reaction space to produce silver oxide ($AgO_x$), and the Mo atom also reacts with O to produce molybdenum oxide ($MoO_x$). The $AgO_x$ and $MoO_x$ are adsorbed onto the glass substrate 10 to form the Ag-containing conductive film 11 ($AgO_x$+$MoO_x$).

At this time, as the activation energy of $AgO_x$ and $MoO_x$ is high, they do not react well with each other, and thus the production of an intermetallic compound can be prevented.

Further, the Ag-containing conductive film 11 formed on the substrate 10 is deposited as a film material hi the crystalline structure to have a low resistance, and further, the adhesive strength with the substrate 10 can be enhanced. In addition, the Mo atom has a reaction velocity to O faster than the Ag atoms. Thus, most of the Mo atoms are oxidized, while a portion of the Ag atoms are oxidized. Accordingly, the Ag-containing conductive film 11 formed on the glass substrate 10 can obtain an electrical property of Ag to the utmost and at the same time the production of an intermetallic compound when forming the Ag-containing conductive film 11 can be prevented.

However, in a case where the partial pressure ratio of the oxygen-containing gas with respect to the inert gas is smaller than about 0.1%, there may be a difficulty in that a bonding force between the Ag-containing conductive film 11 and the glass substrate 10 may be deteriorated and the production of an intermetallic compound may be increased in the sputtering process. Further, it can be seen that, in a case of an Ag-containing conductive film formed by supplying the oxygen-containing gas with an amount less than the partial pressure ratio range, an amorphous structure is partially formed as shown in the photograph of FIG. 5(b).

That is, as the Ag and Mo atoms separated from the target layer 20 do not well react with O, they pass through the reaction space of the chamber 31 in a state of the Ag and Mo atoms. Subsequently, the Ag and Mo atoms are adsorbed onto the substrate 10 to form the Ag-containing conductive film 11 (Ag+Mo). At this time, as the activation energy of the Ag atom is low, it easily reacts with Mo in the reaction space of the chamber 31 so that a difficulty in producing an intermetallic compound occurs. Further, the Ag-containing conductive film 11 formed on the substrate 10 is partially deposited as a film material in an amorphous structure. Thus, there is a difficulty in that the Ag-containing conductive film 11 has a high resistance and the adhesive strength with the substrate 10 lowers.

Further, in a case where the partial pressure ratio of the oxygen-containing gas with respect to the inert gas is larger than 20%, a bonding force between the Ag-containing conductive film 11 and the glass substrate 10 can be enhanced and the production of an intermetallic compound can be prevented. However, as shown in the photograph of FIG. 5(c), there is an oxidation stain produced in the Ag-containing conductive film 11 (a state where a portion of the Ag-containing conductive film 11 is oxidized). Further, there is a difficulty in that the surface roughness of the Ag-containing conductive film 11 formed on the substrate 10 is deteriorated.

The inert gas and the oxygen-containing gas are supplied to the sputtering apparatus at the partial pressure ratio, so that the adhesive strength with the glass substrate 10 is enhanced and the low-resistance Ag-containing conductive film 11 is formed. Thereafter, the supply of the inert gas and the oxygen-containing gas is stopped, the power supply is stopped, and the glass substrate 10 having the Ag-containing conductive film 11 formed in the chamber 31 is then discharged to the outside thereof so as to end the sputtering process.

Referring to FIGS. 2 and 3, a photoresist mask pattern 12 is formed on the Ag-containing conductive film 11. The Ag-containing conductive film 11 is patterned by performing an etching process using the photoresist, mask pattern 12 as an etching mask to form a low-resistance metal wiring pattern 13. Thereafter, the photoresist mask-pattern 12 is removed.

The low-resistance metal wiring pattern 13 may be formed on a transparent insulative substrate through the aforementioned method. Thus, the aforementioned method of forming a low-resistance metal wiring pattern may be applied to a variety of flat display panels.

A method of manufacturing an LCD panel to which the aforementioned method of forming a low-resistance metal wiring pattern is applied according to this exemplary embodiment will be described below.

FIGS. 6 to 9 are views illustrating a method of manufacturing an LCD panel according to an exemplary embodiment of the present invention.

Figure 10:
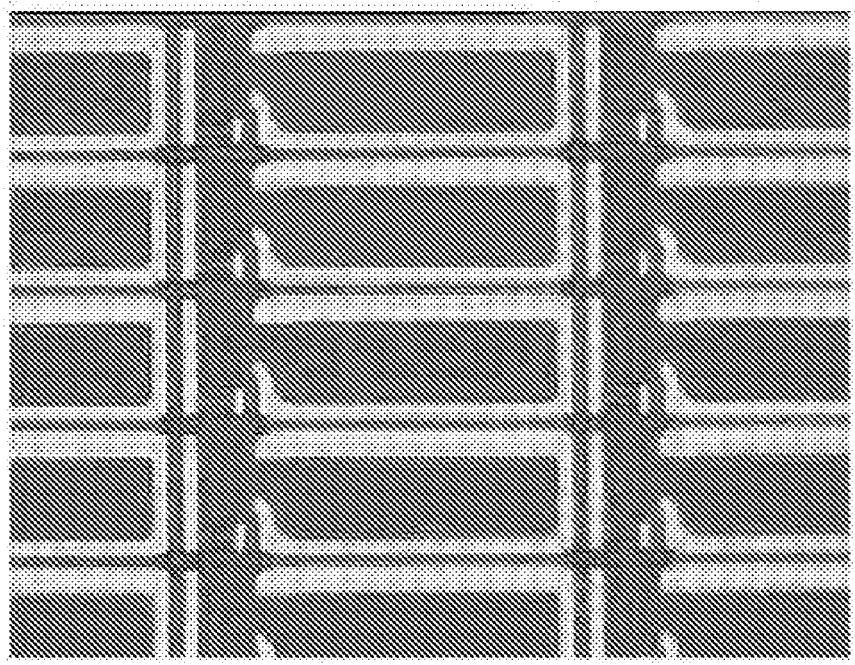
FIGS. 10 and 11 are microphotographs illustrating an adhesive property between a metal wiring pattern and a substrate.
Figure 11:
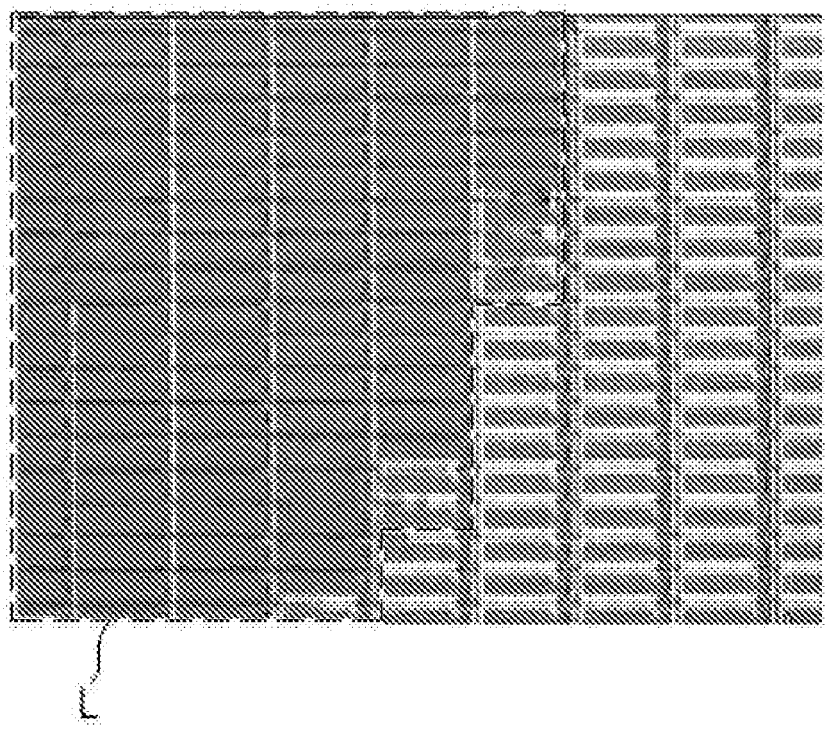

FIGS. 10 and 11 are microphotographs illustrating an adhesive property between a metal wiring pattern and a substrate.

Figure 6:
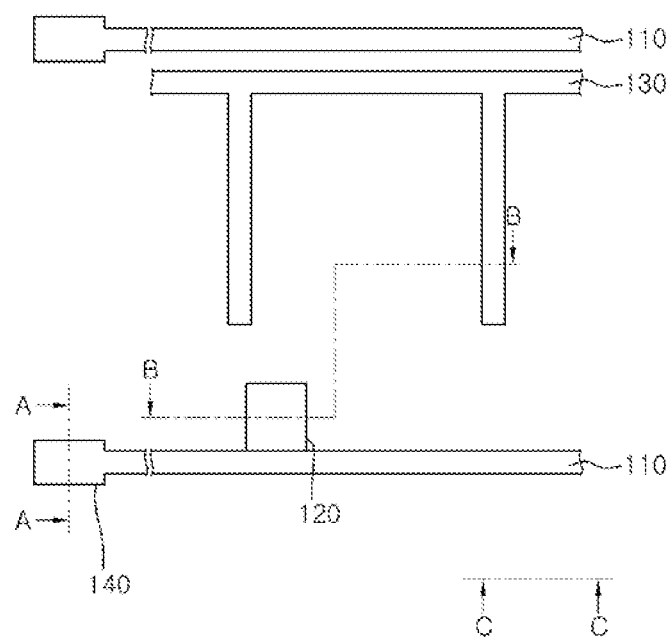
FIGS. 6 to 9 are views illustrating a method of manufacturing a liquid crystal display (LCD) panel according to an exemplary embodiment of the present invention.
Figure 6:
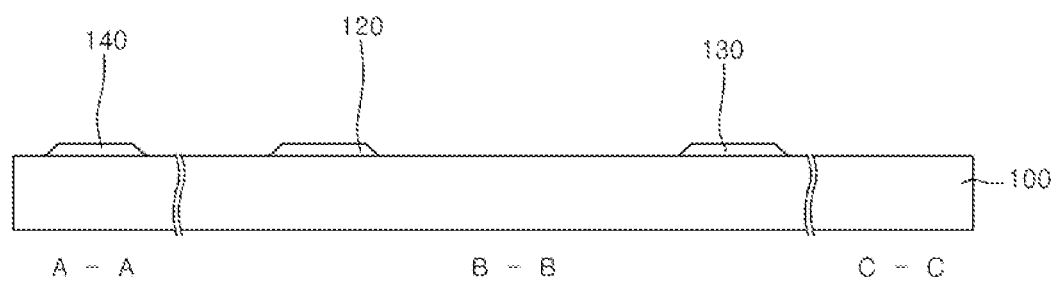

Referring to FIG. 6, an Ag-containing conductive film is formed on a glass substrate 100. The Ag-containing conductive film is patterned to form a gate electrode 120, a gate wiring 110, a storage electrode wiring 130 and a gate pad 140. At this time, the gate electrode 120, the gate wiring 110, the storage electrode wiring 130 and the gate pad 140 have the low resistance characteristics.

The Ag-containing conductive film is formed on the glass substrate 100 through the aforementioned sputtering process. Inert gas and oxygen-containing gas are supplied such that a partial pressure ratio of the oxygen-containing gas to the inert gas becomes about 0.1 to about 20% in the sputtering process. Accordingly, a bonding force between the glass substrate 100 and the Ag-containing conductive film can be enhanced.

A photoresist is applied on the Ag-containing conductive film formed on the substrate 100. Thereafter, a first photoresist mask pattern for exposing a region of the Ag-containing conductive film except regions of the gate electrode 120, the gate wiring 110, the storage electrode wiring 130 and the gate pad 140 is formed through a photolithography process using a first mask. The exposed region of the Ag-containing conductive film is removed by performing an etching process using the first photoresist mask pattern as an etching mask to form the gate electrode 120, the gate wiring 110, the storage electrode wiring 130 and the gate pad 140. After the etching process, the first photoresist mask pattern is removed. As shown in FIG. 6, the gate wiring 110 extends in a horizontal direction and a portion thereof protrudes to form the gate electrode 120. Further, the storage electrode wiring 130 comprises an extension portion extending in parallel with the gate wiring 110 and protrusion portions protruding to an edge of a pixel region.

Figure 7:
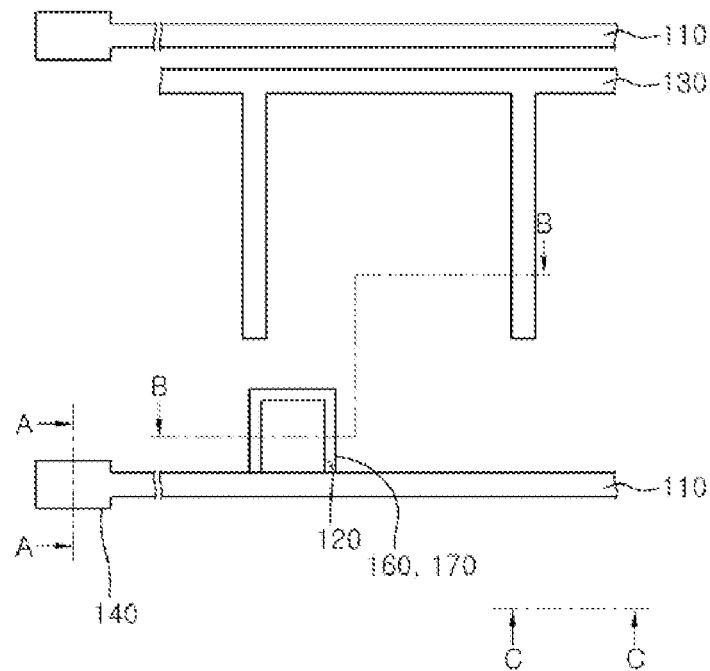
Figure 7:
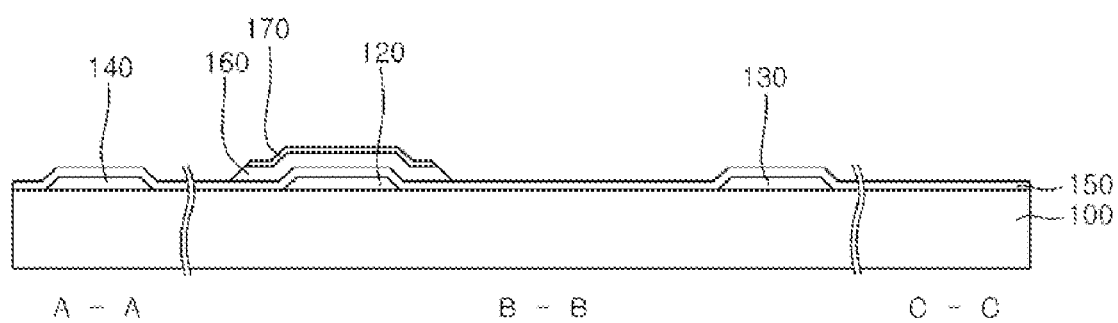

Referring to FIG. 7, a gate insulation film 150 is formed on the entire portion of the substrate 100 having the gate electrode 120 and the gate wiring 110 formed thereon, and an active layer 160 and an ohmic contact layer 170 are formed on a top of the gate electrode 120.

The gate insulation film 150 is formed on the entire portion of the substrate 100 through a deposition method using, for example, plasma enhanced chemical vapor deposition (PECVD), sputtering or the like. At this time, it is preferred that an inorganic insulation substance containing, for example, oxide silicon or nitride silicon be used as the gate insulation film 150. The active layer 160 and ohmic contact layer 170 are formed on the gate insulation film 150 through the aforementioned deposition method. It is preferred that an amorphous silicon layer is used as the active layer 160, and an amorphous silicone layer doped with highly concentrated impurities be used as the ohmic contact layer 170.

A photoresist is applied on the ohmic contact layer 170. A second photoresist mask pattern for exposing a region of the ohmic contact layer 170 except an active region is formed through a photolithography process using a second mask. The exposed region of the ohmic contact layer 170 and a corresponding region of the active layer 160 are removed by performing an etching process using the second photoresist mask pattern as an etching mask to form the active region. After the etching process, the second photoresist mask pattern is removed. Preferably, the active region is patterned in the shape of an island on top of the gate electrode 120.

At this time, it is preferred that a partial pressure ratio of the oxygen-containing gas to the inert gas become about 0.1 to about 20% when forming the Ag-containing conductive film used as the gate electrode 120, gate wiring 110, storage electrode wiring 130 and gate pad 140. Accordingly, if a microphotograph of a substrate is viewed after the active region has been formed, it can be seen that the gate wiring and storage electrode wiring (bright portions of the photograph) are well adhered to a glass substrate as shown in FIG. 10. However, in a case where the partial pressure ratio is less than the above range, as the adhesion between the gate and storage electrode wirings and the substrate is not good, there is a region where a pattern formed on the glass substrate comes loose therefrom as shown in a microphotograph of the substrate (see a region L in FIG. 11).

Figure 8:
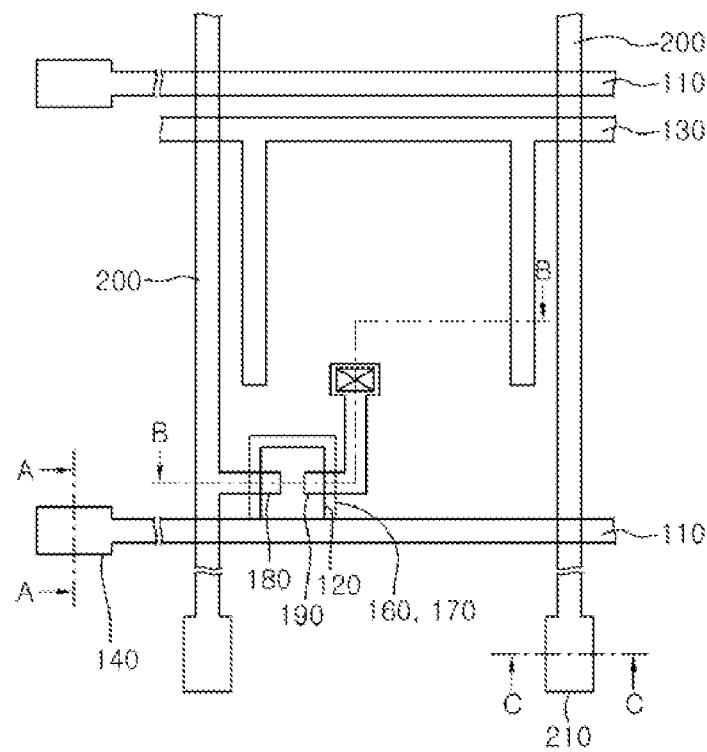
Figure 8:
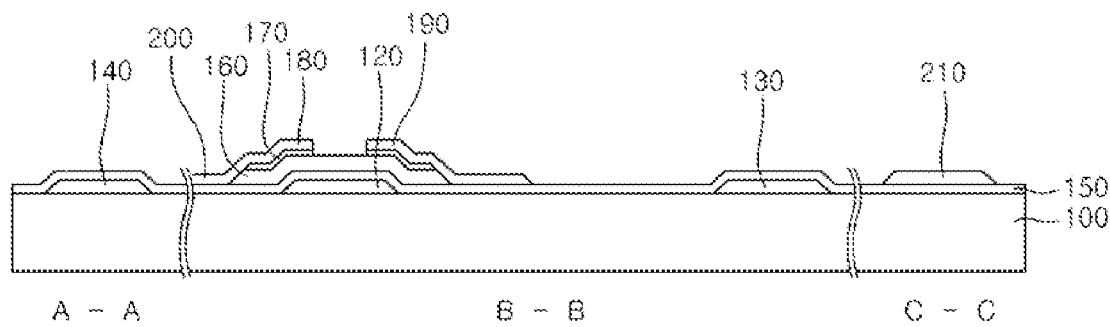

Referring to FIG. 8, an Ag-containing conductive film is formed on the substrate 100 having the active region patterned. The Ag-containing conductive film is patterned to form a source electrode 180, a drain electrode 190, a source wiring 200 and a source pad 210. At this time, the source electrode 180, the drain electrode 190, the source wiring 200 and the source pad 210 have the low resistance characteristics.

The Ag-containing conductive film is formed on the glass substrate 100 having the active region patterned thereon through the aforementioned sputtering process.

A photoresist is applied on the Ag-containing conductive film. A third photoresist mask pattern for exposing a region of the Ag-containing conductive film except regions of the source electrode 180, the drain electrode 190, the source wiring 200 and the source pad 210 is formed through a photolithography process using a third mask. The exposed region of the Ag-containing conductive film is removed by performing an etching process using the third photoresist mask pattern as an etching mask to form the source electrode 180, the drain electrode 190, the source wiring 200 and the source pad 210. Thereafter, portions of the ohmic contact layer 170 exposed through a region between the source and drain electrodes 180 and 190 is removed. After the etching process, the third photoresist mask pattern is removed. Accordingly, a thin film transistor having the gate, source and drain electrodes 120, 180 and 190 is formed. The source wiring 200 extends in a direction perpendicular to the gate wiring 110, and a portion thereof extends to an upper region of the gate electrode 120 to form the source electrode 180. The drain electrode 190 overlaps with the top of the gate electrode 120, and a portion thereof extends to the pixel region. Here, the pixel region with a rectangular shape is defined by the plurality of source and gate wirings 200 and 110.

Figure 9:
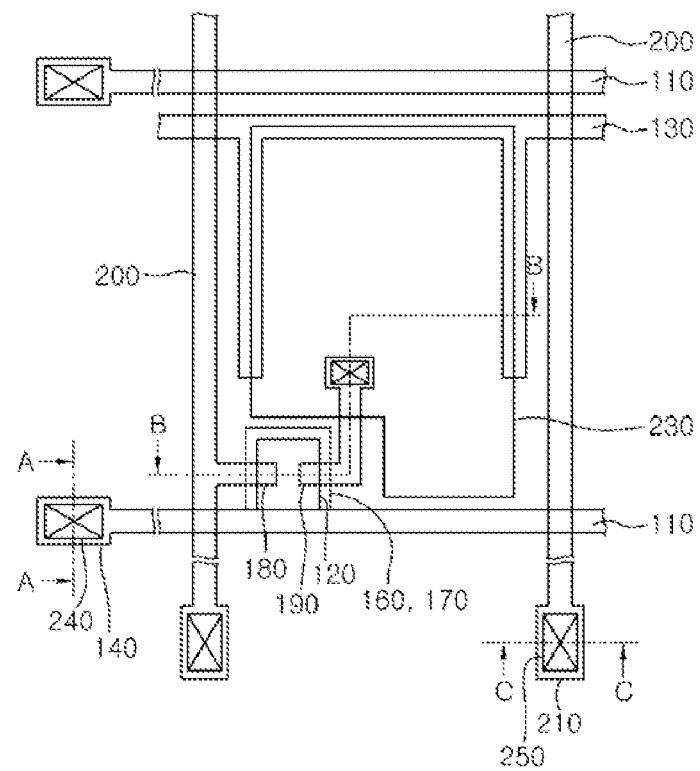
Figure 9:
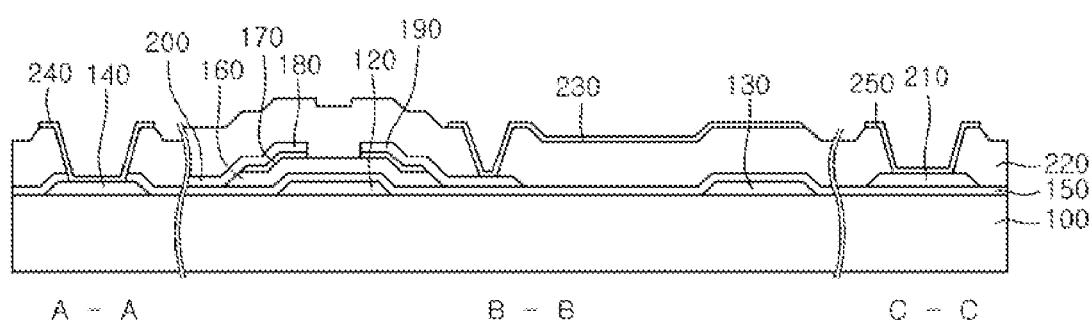

Referring to FIG. 9, an insulation film 220 is formed on the glass substrate 100 having the thin film transistor formed thereon. A portion of the insulation film 220 is patterned to form a drain contact hole for exposing a portion of the drain electrode 190, a gate pad contact hole exposing for the gate pad 140, and a source pad contact hole for exposing the source pad 210.

An organic or inorganic substance is used as the insulation film 220. A photoresist is applied on the insulation film 220, and a fourth photoresist mask pattern is then formed through a photolithography process using a fourth mask. Thereafter, the drain contact hole, the gate pad contact hole and the source pad contact hole are formed by performing an etching process using the fourth photoresist mask pattern as an etching mask. After the contact holes are formed, the fourth photoresist, mask pattern is removed. In a case where a photosensitive organic substance is used as the insulation film 220, the drain contact hole, the gate pad contact hole and the source pad contact hole may be formed by removing a portion of the insulation film 220 through a photolithography process using the fourth mask without applying a photoresist on the insulation film 220.

After applying a transparent conductive film on the entire structure having the contact holes formed thereon, it is patterned using a fifth mask to form a pixel electrode 230 connected to the drain electrode 190 through the drain contact hole, a gate contact pad 240 connected to the gate pad 140 through the gate pad contact hole, and a source contact pad 250 connected to the source pad 210 through the source pad contact hole. The pixel electrode 230 is formed within the pixel region, and a portion of an edge thereof overlaps with the storage electrode wiring 130. It is preferred that Indium Tin Oxide (ITO) or Indium Zinc Oxide (IZO) be used as the transparent conductive film.

Moreover, the aforementioned Ag-containing conductive film may be also used as a wiring for a voltage regulator diode provided in a region between the gate pad 140 and the gate wiring 110 and/or a region between the source pad 210 and the source wiring 200. Further, although the Ag-containing conductive film has been used as both the gate and source wirings in the aforementioned descriptions, it is not limited thereto but one of both the wirings may be made of at least any one of, for example, aluminum (Al), neodymiura (Nd), silver (Ag), chromium (Cr), titanium (Ti), tantalum (Ta) and molybdenum (Mo), or an alloy thereof.

A transparent insulative substrate having a black matrix, a color filter, an overcoat film and a common electrode formed thereon is aligned on the glass substrate 100 having the thin film transistor and the pixel electrode 230 formed thereon as described above. Thereafter, the two substrates are bonded to each other, and a liquid crystal layer is formed between the two substrates to manufacture an LCD panel. It will be apparent that it is not limited thereto but the LCD panel may be manufactured through a variety of methods That is, although the glass substrate having the thin film transistor and pixel electrode formed thereon has been manufactured using five masks in the aforementioned descriptions, it is not limited thereto but the glass substrate having the thin film transistor and pixel electrode formed thereon may he manufactured using, for example, four or three masks. Further, the LCD panel may be manufactured using a liquid crystal dropping method Furthermore, a predetermined cut pattern may be further formed in the pixel electrode, and a protruding pattern may be further formed in the common electrode. In addition, the unit pixel region may be divided into two sub-pixels to drive the respective sub-pixels as different thin film transistors.

Moreover, in the exemplary embodiments of the present invention, a protection film is formed on a top of the metal wiring pattern made of the aforementioned Ag-containing conductive film, so that damage to the metal wiring pattern generated in a subsequent process can he prevented. A method of forming a metal wiring pattern, according to another exemplary embodiment of the present invention, will be described below with reference to the following figures. Descriptions overlapping with the previously described exemplary embodiment will be omitted.

FIGS. 12 to 15 are sectional views illustrating a method of forming a metal wiring pattern according to another exemplary embodiment of the present invention.

Figure 12:
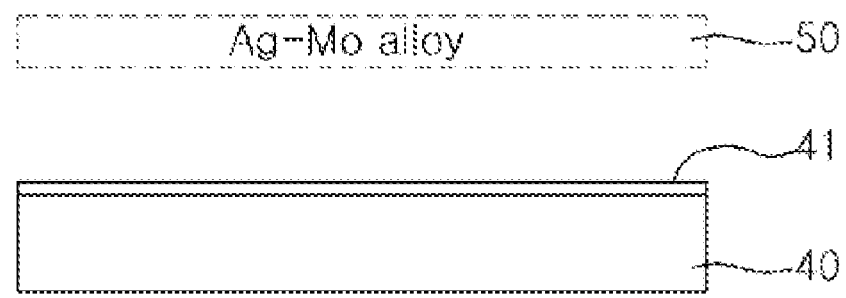
FIGS. 12 to 15 are sectional views illustrating a method of forming a metal wiring pattern according to an exemplary embodiment of the present invention.

Referring to FIG. 12, an Ag-containing conductive film 41 is formed on a glass substrate 40 that, is a transparent insulative substrate through a sputtering method.

Inert gas and oxygen-containing gas are supplied together in the sputtering process, so that an adhesive property between the glass substrate 40 and the Ag-containing conductive film 41 formed thereon can be enhanced. At this time, it is preferred that Ar be used as the inert gas, and a partial pressure ratio of the oxygen-containing gas to the Ar gas be about 0.1 to about 20%. Accordingly, the bonding force between the Ag-containing conductive film 41 and the glass substrate 40 can be enhanced and an intermetallic compound can be prevented from being produced by the reaction of Ag and Mo atoms in the sputtering process as described above.

Figure 13:
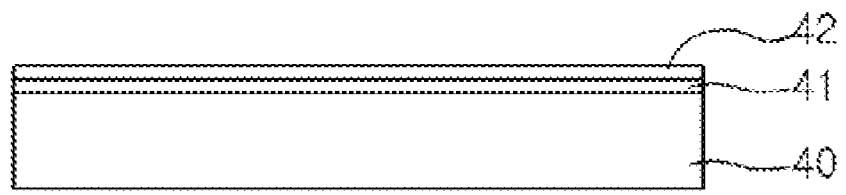

Referring to FIG. 13, a conductive protection film 42 is formed on the Ag-containing conductive film 41.

At this time, it is preferred that IZO he used as the protection film 42. Thus, the Ag-containing conductive film 41 and the conductive protection film 42 can be patterned using IZO as the conductive protection film 42 through a one-time etching process.

Also, if a metallic conductive film is on top of an Ag-containing film, etchants or etching gases for etching the respective films are different, it may be difficult to remove the two films (e.g., the metallic conductive film and the Ag-containing film) through a one-time etching process.

However, in this exemplary embodiment, an IZO film easily etched even in a weak acid is used as the conductive protection film 42, whereby the Ag-containing conductive film 41 and the protection film 42 can be simultaneously removed through a one-time etching process for the Ag-containing conductive film 41.

Further, the Ag-containing conductive film 41 and the conductive protection film 42 may be etched through not only dry etching but also wet etching. Generally, in a case where a metallic film is wet-etched, a phenomenon may occur in which a side region of the film patterned under a photoresist mask pattern is etched by mean of an etchant. As a result, an oxidation reaction may occur in the side region of the metallic film exposed to the etchant, e.g., a phenomenon in which a metal ion is separated from an electron in the side region. In addition, there may he a difficulty in that a metal wiring pattern is not smoothly etched due to the above phenomenon, such that the width of a metal wiring pattern is not patterned uniformly, and the wiring may be disconnected in a portion of a region.

However, in a case where the Ag-containing conductive film 41 and the conductive protection film 42 using IZO are laminatedly formed in this exemplary embodiment, a potential difference causes an etch stop to occur, so that an improved metal wiring pattern can be formed through even a wet etching. That is, an electron is supplied from an IZO film patterned under the photoresist, so that a phenomenon in which a metallic ion is separated in the side region of the Ag-containing conductive film can be prevented.

Figure 14:
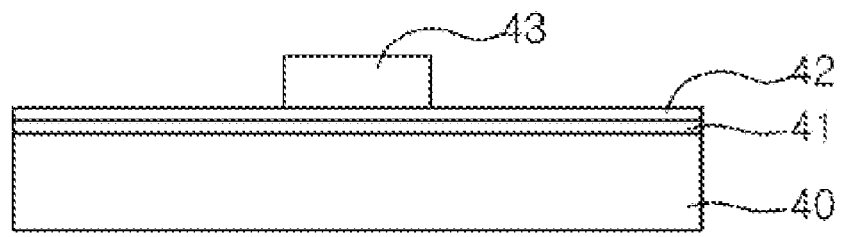
Figure 15:
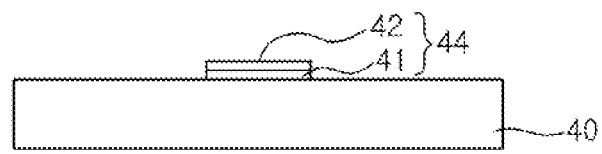

Referring to FIGS. 14 and 15, a photoresist is applied on the conductive protection film 42, and a photoresist mask pattern 43 is formed through a photolithography process using a mask. The conductive protection film 42 and the Ag-containing conductive film 41 are removed by performing an etching process using the photoresist mask pattern 43 as an etching mask to form a low-resistance metal wiring pattern 44. After the etching process, the photoresist mask pattern 43 is removed.

At this time, the etching process may be performed through not only dry etching but also wet etching as described above. In a case where wet etching is performed, the conductive protection film 42 and the Ag-containing conductive film 41 may be removed together using only an etch ant for etching an Ag alloy.

The conductive protection film 42 of the low-resistance metal wiring pattern 44 manufactured in such a manner can prevent damage to the Ag-containing conductive film 41 generated when the metal wiring pattern 44 is exposed to the outside through a subsequent etching process. Thus, it is preferred that the conductive protection film 42 be formed to thickness of about 100 to about 1000 angstroms (Å). More preferably, the conductive protection film 42 be formed to a thickness of about 200 to about 500 Å. If the conductive protection film 42 is manufactured thinner than a thickness of about 100 Å, it may not serve as a barrier in the subsequent etching process. Accordingly, the Ag-containing conductive film 41 is damaged. On the other hand, if the conductive protection film 42 is manufactured thicker than to thickness of about 1000 Å, there may be a difficulty in that the thickness and resistance of the metal wiring pattern 44 are increased.

The aforementioned Ag-containing conductive film and the low-resistance metal wiring pattern having the conductive protection film provided on top thereof may be formed on a transparent insulative substrate. The aforementioned low-resistance metal wiring pattern may be used in a variety of flat display panels using the transparent insulative substrate.

A method of manufacturing an LCD panel, to which the low-resistance metal wiring pattern according to the aforementioned exemplary embodiment is applied, will be described below.

FIGS. 16 to 20 are sectional views a method of manufacturing an LCD panel according to an exemplary embodiment of the present invention.

Figure 21:
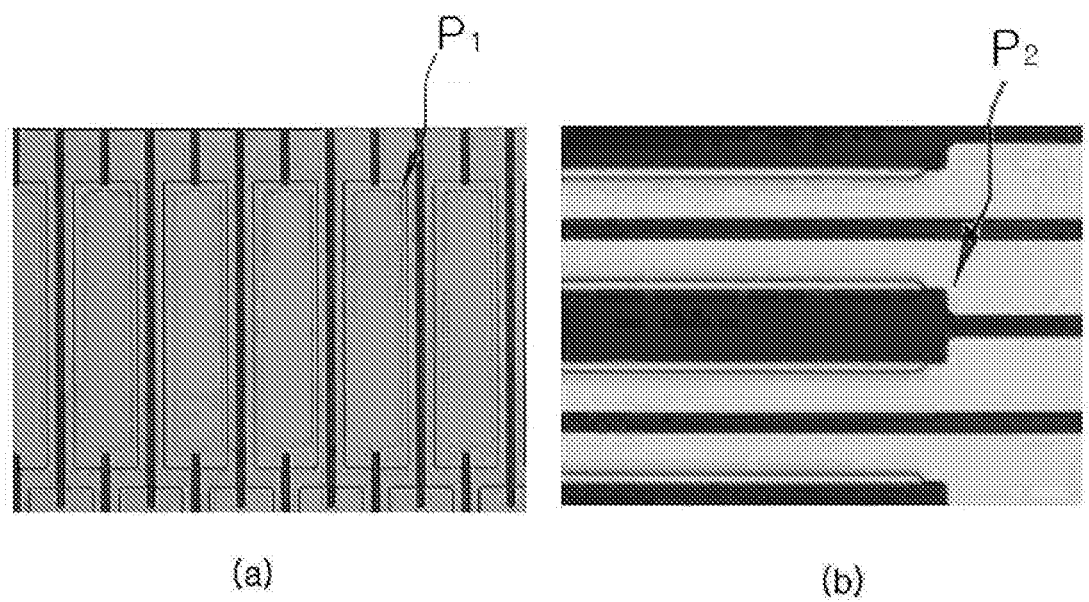
FIG. 21 shows microphotographs observed by irradiating a pad region of the LCD panel according to an exemplary embodiment of the present invention with light.

FIG. 21 shows microphotographs observed by irradiating light in a pad region of the LCD panel according to an exemplary embodiment.

Figure 16:
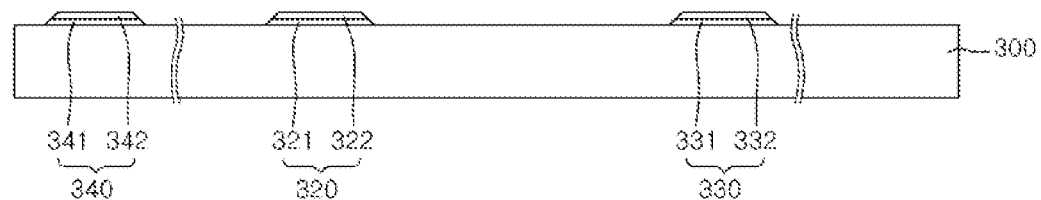
FIGS. 16 to 20 are sectional views illustrating a method of manufacturing an LCD panel according to an exemplary embodiment of the present invention.

Referring to FIG. 16, Ag-containing conductive films 321, 331 and 341 and conductive protection films 322, 332 and 342 are formed on a glass substrate 300. The Ag-containing conductive films 321, 331 and 341 and the conductive protection films 322, 332 and 342 are patterned to form a gate electrode 320, a gate wiring, a storage electrode wiring 330, and a gate pad 340.

The Ag-containing conductive films 321, 331 and 341 are formed through a sputtering process. To enhance a bonding force between the Ag-containing conductive films 321, 331 and 341 and the glass substrate 300, a partial pressure ratio of oxygen-containing gas to inert gas should become about 0.1 to about 20% in the sputtering process.

The conductive protection films 322, 332 and 342 are formed to a thickness of about 1000 Å on the Ag-containing conductive films 321, 331 and 341, respectively. At this time, it is preferred that IZO be used as the conductive protection films 322, 332 and 342, and the Ag-containing conductive films 321, 331 and 341 and the conductive protection films 322, 332 and 342 be removed through a one-time dry or wet etching process. That is, a photoresist is applied on the conductive protection films 322, 332 and 342, and a first photoresist mask pattern is formed through a photolithography process using a first mask. The conductive protection films 322, 332 and 342 and the Ag-containing conductive films 321, 331 and 341 are etched by performing an etching process using the first photoresist mask pattern as an etching mask to form the gate electrode 320, the gate wiring, the storage electrode wiring 330 and the gate pad 340. Dry or wet etching may be performed as the etching process.

As the Ag-containing conductive films 321, 331 and 341 and the conductive protection films 322, 332 and 342 may be etched together by means of an etchant for etching the Ag-containing conductive films 321, 331 and 341 in the wet etching, the gate electrode 320, the gate wiring, the storage electrode wiring 330 and the gate pad 340 can be formed through a one-time etching process. Further, as wet etching may be performed using wet etching equipment used in a current LCD panel production line, expensive equipment for dry etching is not employed and thus production costs can be reduced.

Figure 17:
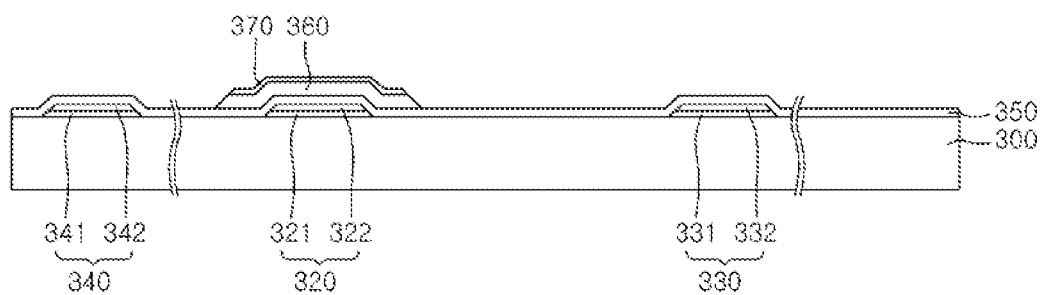

Referring to FIG. 17, a gate insulation film 350 is formed on the entire portion of the substrate 300 having the gate electrode 320 and the gate wiring formed thereon, and an active layer 360 and an ohmic contact layer 370 are formed on a top of the gate electrode 320. An island-shaped active region having the active layer 360 and the ohmic contact layer 370 is formed on the top of the gate electrode 320.

Figure 18:
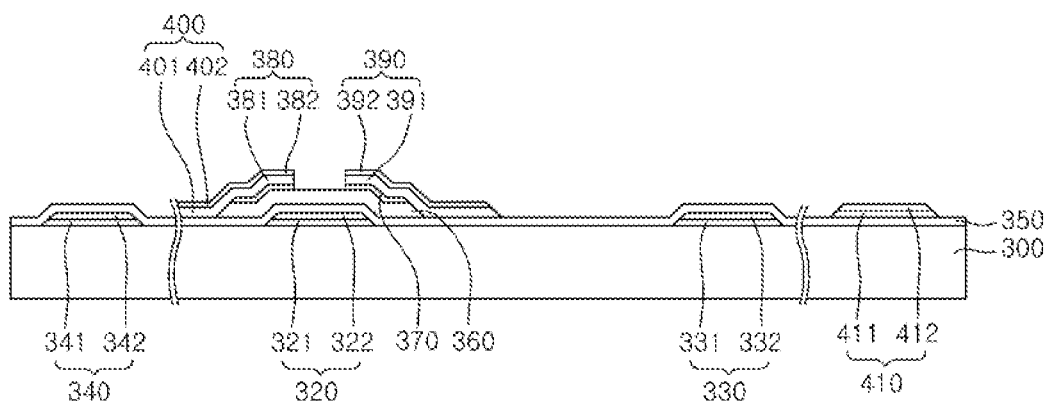

Referring to FIG. 18, an Ag-containing conductive films 381, 391, 401 and 411 and conductive protection films 382, 392, 402 and 412 are sequentially formed on the substrate 300 having the active region patterned thereon. The Ag-containing conductive films 381, 391, 401 and 411 and the conductive protection films 382, 392, 402 and 412 are patterned to form a source electrode 350, a drain electrode 390, a source wiring 400 and a source pad 410. The ohmic contact layer 370 exposed between the source and drain electrodes 380 and 390 is removed. Accordingly, a thin film transistor having the gate, source and drain electrodes 320, 380 and 390 is formed.

Figure 19:
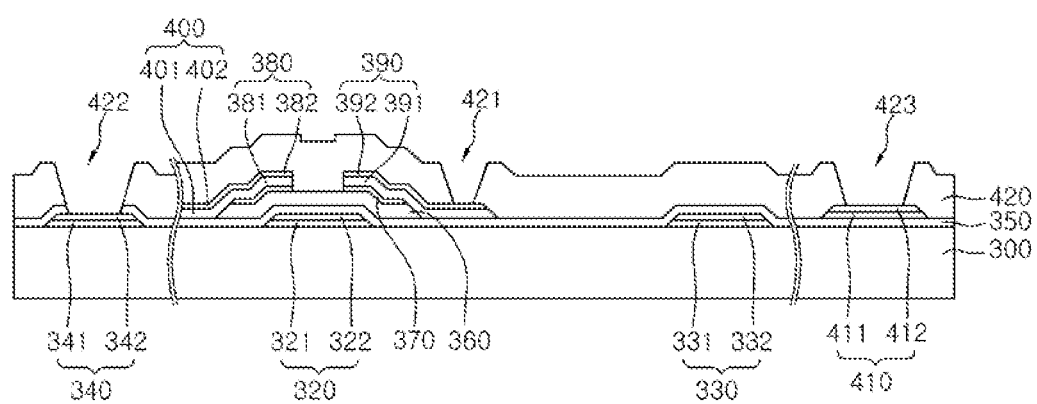

Referring to FIG. 19, an insulation film 420 is formed on the glass substrate 300 having the thin film transistor formed thereon. A portion of the insulation film 420 is patterned to form a drain contact hole 421 exposing a portion of the drain electrode 390, a gate pad contact hole 422 exposing the gate pad 340, and a source pad contact hole 423 exposing the source pad 410.

That is, a photoresist is applied on the insulation film 420, and a photoresist mask pattern is formed through a photolithography process using a mask. The drain contact hole 421, the gate pad contact hole 422 and the source pad contact hole 423 respectively partially exposing the drain electrode 390, the gate pad 340 and the source pad 410 are formed by performing an etching process using the photoresist mask pattern as an etching mask.

At this time, the gate and source pads 340 and 410 comprises the Ag-containing conductive films 341 and 411 and the conductive protection films 342 and 412 formed thereon, respectively. Here, the conductive protection films 342 and 412 prevent damage to the Ag-containing conductive films 341 and 411 in the etching process for forming the contact holes. Accordingly, a phenomenon can be prevented in which the Ag-containing conductive films 341 and 411 are separated from the lower structure (e.g., the substrate) after the contact holes are formed.

However, in a case where the conductive protection films 342 and 412 do not exist, there may be a difficulty in that the Ag-containing conductive films 341 and 411 may become damaged, so that they are separated from the lower structure when the contact holes are formed. That is, in a case where the conductive protection films 342 and 412 do not exist as shown in a photograph of FIG. 21(*a*), if light is irradiated upwardly from a bottom of the glass substrate 300 after the contact holes are formed, a pad region appears bright (see P1 in FIG. 21(*a*)). This means that the Ag-containing conductive films 341 and 411 in the pad region are separated from the lower structure. However, in a case where the conductive protection films 342 and 412 exist as shown in the photograph of FIG. 21(*b*), if light is irradiated upward from a bottom of the glass substrate 300 after the contact holes are formed, the pad region appears dark (see P2 in FIG. 21(*b*)). This means that the Ag-containing conductive films 341 and 411 remain in the pad region. As such, the conductive protection films 342 and 412 are formed on the Ag-containing conductive films 341 and 411, so that damage to the Ag-containing conductive films 341 and 411 formed under the conductive protection films 342 and 412 can be prevented in the etching process for forming the contact holes.

Figure 20:
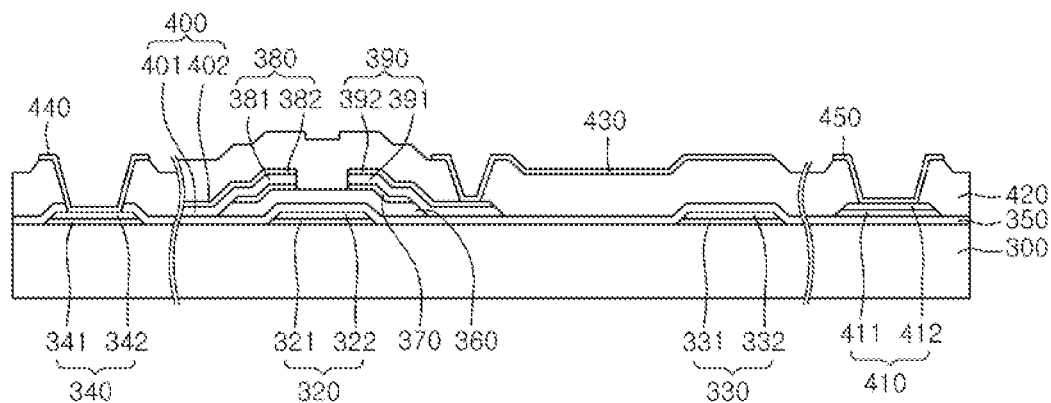

Referring to FIG. 20, a transparent conductive film is applied on the entire structure having the contact holes formed thereon and then patterned to form a pixel electrode 430 connected to the drain electrode 390 through the drain contact hole 421, a gate contact pad 440 connected to the gate pad 340 through the gate pad contact hole 422, and a source contact pad 450 connected to the source pad 410 through the source pad contact hole 423.

Accordingly, a lower substrate having the thin film transistor and the pixel electrode formed thereon is manufactured. Thereafter, a transparent insulative substrate having a black matrix, a color filter, an overcoat film and a common electrode, formed thereon is bonded together with the lower substrate, and a liquid crystal layer is formed therebetween, so that an LCD pad is manufactured.

Although an LCD panel with a low-resistance metal wiring pattern has been described in this exemplary embodiment, the aforementioned method of forming a low-resistance metal wiring pattern is not limited thereto but may be applied to a variety of flat display panels such as, for example, plasma display panels (PDPs) and organic electroluminescent (ELs) displays.

As described above, according to exemplary embodiments of the present invention, an oxygen-containing gas is supplied in a process of forming an Ag-containing conductive film on a glass substrate, so that an adhesive property between the Ag-containing conductive film and the glass substrate can be enhanced.

Also, the ratio of oxygen-containing gas to inert gas supplied in a sputtering process is adjusted, so that a phenomenon can be prevented in which an intermetallic compound is formed by the reaction of Ag and Mo atoms.

Further, a conductive protection film is formed on an Ag-containing conductive film, so that damage to the Ag-containing conductive film can be prevented.

Furthermore, IZO is used as a conductive protection film, so that an Ag-containing conductive film and the conductive protection film can be patterned through a one-time etching process, and a wet etching process can be applied.

Having described the exemplary embodiments, it is further noted that it is readily apparent to those of reasonable skill in the art that various modifications may be made without departing from the spirit and scope of the invention which is defined by the metes and bounds of the appended claims.

What is claimed is:

1. A method of manufacturing a liquid crystal display panel, comprising:
    forming a first silver (Ag)-containing conductive film on a transparent substrate;
    forming a first conductive protection film comprising IZO (Indium Zinc Oxide) on the first Ag-containing conductive film;
    pattering the first Ag-containing conductive film and the first conductive protection film to form a gate electrode, a gate wiring, a storage electrode wiring and a gate pad;

forming a gate insulation film on the entire structure comprising the gate electrode, the gate wiring, the storage electrode wiring and the gate pad formed on the transparent substrate;

forming an active layer in an upper region of the gate electrode; and forming source and drain electrodes provided on the active layer and partially overlapping with the gate electrode, a source wiring connected to the source electrode, and a source pad.

2. The method as claimed in claim 1, wherein the oxygen-containing gas is supplied with a supply amount of about 0.1 to about 20% with respect to a supply amount of the inert gas.

3. The method as claimed in claim 1, wherein the oxygen-containing gas is supplied with a supply amount of about 5 to about 15% with respect to a supply amount of the inert gas.

4. The method as claimed in claim 1, wherein the oxygen-containing gas is supplied with a supply amount of about 6 to about 8% with respect to a supply amount of the inert gas.

5. The method as claimed in claim 1, wherein the forming of the source electrode, the drain electrode, the source wiring and the source pad comprises:

forming a second silver (Ag)-containing conductive film on the entire structure having the active layer formed thereon; and patterning the second Ag-containing conductive film, wherein the second Ag-containing conductive film is formed by supplying an inert gas and an oxygen-containing gas.

6. The method as claimed in claim 5, further comprising the forming of a second conductive protection film on the second Ag-containing conductive film.

7. The method as claimed in claim 1, after the forming of the source electrode, the drain electrode, the source wiring and the source pad, further comprising:

forming an insulation film on the entire structure comprising the source electrode, the drain electrode, the source wiring and the source pad formed on the transparent substrate, patterning the insulation film to form a drain contact hole opening a portion of the drain electrode, a gate pad contact hole opening a portion of the gate pad, and a source pad contact hole opening a portion of the source pad;

forming a transparent film on the entire structure having the contact holes formed thereon; and patterning the transparent film to form a pixel electrode connected to the drain electrode through the drain contact hole, a gate contact pad connected to the gate pad through the gate pad contact hole, and a source contact pad connected to the source pad through the source pad contact hole.

8. The method of claim 1, wherein the Ag-containing conductive film further comprises molybdenum (Mo).

9. The method as claimed in claim 1, wherein the first Ag-containing conductive film is an Ag alloy and is formed by supplying an inert gas and an oxygen-containing gas.

10. A method of manufacturing a liquid crystal display panel, comprising;

forming a first signal line including a gate electrode, a gate wiring, a storage electrode wiring and a gate pad on a transparent substrate;

forming a gate insulation film on the first signal line;

forming an active layer in an upper region of the gate electrode; and forming a second signal line including a source wiring connected to the source electrode, a source pad and drain electrode on the active layer;

wherein at least one of the first signal line and the second signal line comprise a first silver (Ag)—Mo containing conductive film; and forming a first conductive protection film including IZO (Indium Zinc Oxide) on the first Ag—Mo containing conductive film.

11. A method as claimed in claim 10, wherein the first Ag—Mo containing conductive film is formed by supplying an inert gas and an oxygen-containing gas.

12. The method as claimed in claim 10, after the forming of the source electrode, the drain electrode, the source wiring and the source pad, further comprising;

forming an insulation film on the entire structure comprising the source electrode, the drain electrode, the source wiring and the source pad formed on the transparent substrate, patterning the insulation film to form a drain contact hole opening a portion of the drain electrode, a gate pad contact hole opening a portion of he gate pad, and a source pad contact hole opening a portion of the source pad;

forming a transparent film on the entire structure having the contact holes formed thereon; and patterning the transparent film to form a pixel electrode connected to the drain electrode through the drain contact hole, a gate contact pad connected to the gate pad through the gate pad contact hole, and a source contact pad connected to the source pad through the source pad contact hole.

* * * * *